United States Patent [19]

Havemann et al.

[11] Patent Number: 4,621,411

[45] Date of Patent: Nov. 11, 1986

[54] LASER-ENHANCED DRIVE IN OF SOURCE AND DRAIN DIFFUSIONS

[75] Inventors: Robert H. Havemann, Garland; Vernon R. Porter, Plano, both of Tex.

[73] Assignee: Texas Instruments Incorporated, Dallas, Tex.

[21] Appl. No.: 656,048

[22] Filed: Sep. 28, 1984

[51] Int. Cl.$^4$ .................. H01L 21/263; H01L 21/265
[52] U.S. Cl. ..................................... 29/571; 29/576 B; 29/576 T; 148/1.5; 148/175; 148/187; 148/DIG. 91; 357/91
[58] Field of Search .................. 29/571, 576 B, 576 T; 148/1.5, 187, 175; 357/91

[56] References Cited

U.S. PATENT DOCUMENTS

| | | | |
|---|---|---|---|
| 4,226,650 | 10/1980 | Takahashi et al. | 148/188 |
| 4,243,433 | 1/1981 | Gibbons | 148/1.5 |
| 4,364,778 | 12/1982 | Leamy et al. | 148/1.5 |
| 4,369,072 | 1/1983 | Bakeman, Jr. et al. | 148/1.5 |
| 4,379,727 | 4/1983 | Hansen et al. | 148/1.5 |
| 4,434,013 | 2/1984 | Bol | 148/1.5 |
| 4,468,855 | 9/1984 | Sasaki | 29/576 B |
| 4,502,205 | 3/1985 | Yahano | 29/576 B |

FOREIGN PATENT DOCUMENTS 0135972 10/1981 Japan .

OTHER PUBLICATIONS

Koyanagi et al, Appl. Phys. Letts. 35, (1979), 621.
Yonezawa et al, in Semiconductor Silicon, 1977.
Ed. Huff et al, Electrochem. Soc. Proc. vol. 77-2, Princeton, p. 658.
Fowler et al, IBM-TDB, 24 (1981), 1090.
White et al, in Laser-Solid Interactions . . . , ed. Narayan et al, North-Holland, N.Y., 1982, p. 287.
Joshi et al, IBM-TDB, vol. 13, (1970), 928.
Hess et al, Ibid, p. 337.

Primary Examiner—Upendra Roy
Attorney, Agent, or Firm—Robert Groover, III; James T. Comfort; Melvin Sharp

[57] ABSTRACT

Optical illumination rather than furnace heating is used to drive in MOSFET source and drain diffusions, preferably using a surface layer of antimony as the dopant source. This results in substantially less overlap between the gate and the source and drain diffusions. Similarly, if the present invention is practiced in a process having gate sidewalls less than zero overlap can be achieved.

10 Claims, 1 Drawing Figure

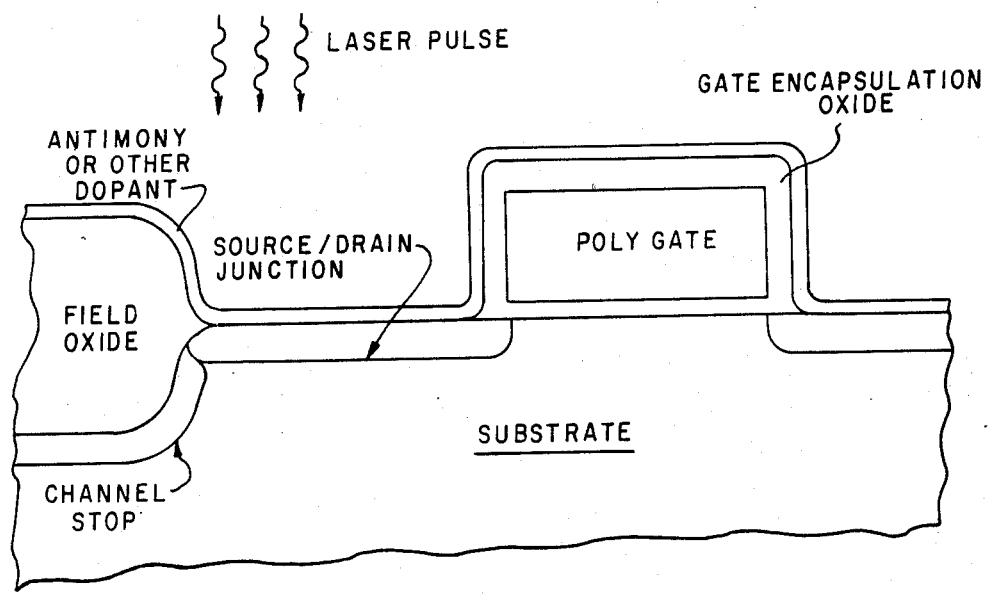

LASER-ENHANCED DRIVE IN OF SOURCE AND DRAIN DIFFUSIONS

BACKGROUND AND SUMMARY OF THE INVENTION

The present invention relates to a method for fabricating field effect transistor devices.

As gate lengths of MOSFET devices are scaled downward, junction depths for source/drain diffusion must also be decreased to avoid excessive encroachment of source/drain diffusion boundaries under the gate. However, a tradeoff must be made between junction depth and diode sheet resistance—if the junction is too shallow, sheet resistance will be high and device performance (speed) will be limited. Using a low energy arsenic source/drain implant, the practical lower limit for junction depth in optimized short channel MOSFETs is around 150 nm, and the subsequent loss of channel length due to lateral spread of implanted arsenic ions is therefore at least 300 nm for submicron MOSFETS. For a small device even 300 nm represents a significant loss of defined channel length and severely limits device performance.

Several techniques have been used to offset the source/drain implant from the gate and thereby compensate for lateral spread. For example, a sidewall oxide on the polysilicon gate may be used as an offset mask. This technique places stringent demands upon plasma etch uniformity and reproducibility—otherwise unacceptable variations in source/drain junction profiles will be introduced into the process.

Thus it is an object of the present invention to provide a method for fabricating MOSFET transistors with minimal spread of source and drain diffusions underneath the gate.

It is a further object of the present invention to provide a method for fabricating MOSFETs which have minimal overlap between the gate and the source and drain diffusions, without requiring any critically controlled etching steps.

The present invention teaches use of laser-driven diffusion rather than thermally-driven diffusion to drive in the source and drain diffusions. Since the laser illumination is partially screened by the edge of the gate, the temperature profile underneath the gate is highly nonuniform. Since the localized temperature is much higher in the portions of the silicon which are not underneath the gate, diffusion proceeds more rapidly in those surfaces. Thus, the effect of this temperature gradient is that lateral diffusion into the area underneath the gate is retarded with respect to the vertical diffusion which occurs.

A further difficulty with prior art processes for forming source/drain diffusions is the amount of high-temperature history required. For example, in processes using buried contacts, and particularly in advanced CMOS processes using silicided buried contacts and/or both n-type and p-type polysilicon, these complex structures will already be present when the source/drain implants are driven. Reduction of the high-temperature time required at this early stage of the process would make fabrication of buried contacts and multilayer grate-level-interconnect structures much simpler.

A further consideration as VLSI progresses is the increasing sensitivity of the scaled gate oxides. Among the factors in processing which can degrade gate oxides is radiation damage. The radiation induced by ion implantation will typically not be disastrous, but scattered radiation and hot carriers generated by the radiation are capable of inducing empty traps and/or trapped carriers in the gate oxide underneath the polysilicon. The heaviest implant source of gate oxide radiation damage is likely to be the source/drain implant. If this implant could be reduced, damage to gate oxides would also be reduced. Although not presently an urgent problem, any improvement in gate oxide quality is desirable.

The present invention teaches a source/drain drive-in using transient radiant heating. Preferably a highly concentrated surface deposition provides the source of the dopant species, but alternatively an ion implant may be used for the initial dopant introduction, or both implant and surface deposition of different species may be combined.

According to the present invention there is provided:
A method for fabricating a field-effect transistor, comprising the steps of:
providing a semiconductor surface having a first conductivity type;
providing, near said semiconductor surface, a gate electrode defining a channel region within said semiconductor surface beneath said gate electrode, said semiconductor surface also containing source and drain regions separated by said channel region;
introducing a dopant impurity having a second conductivity type at said semiconductor surface in said source and drain regions;
illuminating said source and drain regions with pulsed radiant heating, whereby said second-type impurity is ionized within said semiconductor surface at said source and drain regions.

BRIEF DESCRIPTION OF THE DRAWINGS

The present invention will be described with reference to the accompanying drawings, wherein:
FIG. 1 shows a sample embodiment of the invention.

DESCRIPTION OF THE PREFERRED EMBODIMENTS

The present invention has demonstrated use of laser source/drain fabrication. The presently preferred embodiment yields shallow junctions (150 nm) with minimal lateral diffusion (gate encroachment) and offers the further advantage of extremely low diode sheet resistance (20 ohms/cm). This technique has been demonstrated for the particular case of n-channel MOSFETs with gate lengths as small as 0.75 umicron. A specific exemplary process will now be described.

Standard MOS processing is used up to and including polysilicon gate definition and etch. A short stream oxidation then establishes a differential oxide thickness over the doped polysilicon and substrate, which is etched back to clear the substrate, leaving a thin oxide layer (e.g. 100 nm) on the polysilicon. A thin layer of dopant is then deposited, in this case 5–19 nm of antimony, and irradiated by a laser (a Q-switched ruby laser was used in this experiment) to drive the dopant into the substrate and form a shallow junction (estimated to be around 150 nm from ion microprobe data). Any excess dopant left on the surface is then etched off (aqua regia was used as an antimony etchant), and plasma oxide is deposited for interlevel oxide. Contacts are patterned and cut, and an amorphous silicon layer (approximately 30 nm thick) is deposited prior to Al-Si deposition to serve as a sacrificial layer during contact sinter and prevent aluminum spiking through the shallow junction. Standard processing is used for metal definition and etch.

Note that high temperature processing is preferably minimized after the antimony drive to avoid possible precipitation of the Sb from supersaturated solution. However, it is generally preferable to reduce thermal history in IC processing, and many process improvements are aimed at this goal. Thus, the present invention is most preferably used in combination with such process enhancements as flash reflow for MLO planarization, or no MLO reflow at all (using stud contacts and anisotropically etched contact holes). Similarly, heavy contact implants are also preferably avoided (e.g. by using an amorphous silicon sacrificial layer in the contact hole), since implant activation would require a high temperature anneal and possibly lead to Sb precipitation. Antimony is a slow diffusing dopant, so thermal history for antimony is not a problem aside from the question of precipitation. However, the conditions which will induce precipitation of antimony from saturated solution are not known, in the context of practical processing variations, so minimization of high-temperature steps is desirable.

If the present invention is practiced using an antimony dopant, the result of the illumination step will be a supersaturated concentration of antimony. That is, the source/drain regions will have antimony concentrations in the neighborhood of $10^{21}$ ions per cc, which, for a junction depth of 1500 A, would result in a sheet resistance in the neighborhood of 20 ohms/cm., which is adequately low. This supersaturated solution is not unstable at room temperature, since the mobility of the antimony at room temperature is so low that migration of the antimony to precipitation locations, even if precipitation were nucleated, is very slow. See R. Stuck et al., "Properties of P-N Junctions Prepared on Antimony Covered Silicon By Laser Induced Diffusion", page 193, to 208, Proceedings of the Symposium on Laser and Electron Beam Processing of Electronic Materials, Vol. 80-1, 1980 which is hereby incorporated by reference.

It should be noted that an important limitation on maximum power which can be used is that the polysilicon gate must not be damaged by the incident power. However, if powers higher than about 0.3 Joules/sq. cm. are desired to be used, a transparent heat sink layer can be top deposited over the polysilicon, which will reduce damage to the patterned polysilicon level. Alternatively, it may be preferable to pattern the polysilicon using a thermally conductive hardmask (e.g. of metal) which is left in place during radiant-heating activation of the source/drain implants.

A further embodiment of the present invention uses both a surface-applied, slow-diffusing dopant and an implanted faster-diffusing dopant or dopants. For example, phosphorus can be implanted, antimony applied as discussed, and transient radiant heating applied. The transient heating will cause the antimony to indiffuse and ionize (activate), while also at least partially activating the phosphorus. This results in a graded drain structure, reducing the electric field at the drain boundary and minimizing the undesirable hot-carrier effects. However, such a graded drain structure will result even if only one species of dopant is both implanted and applied. The drive-in of the surface layer will give a very shallow degenerately doped region (which may be saturated or supersaturated) while the implanted distribution will provide a less-conductive surrounding region.

The surface applied source need not be the pure dopant element. A wide variety of surface-deposited sources may be used, as long as the surface concentration achieved is high enough to provide the dopant supply for the desired sheet resistance in the driven-in source/drain regions.

It will be recognized by those skilled in the art that the present invention can also be applied to formation of various field effect devices, including MOSFETs, MESFETs, or any other field-effect device having a lateral channel between laterally separated source and drain regions. The present invention is not limited only to silicon, but can also be applied to gallium arsenide or other semiconducting materials.

Other modifications and variations in the practice of the present invention are also possible, and the invention is not limited except as claimed below.

Thus, the present invention provides the key advantage that lateral spread of the source and drain junctions underneath the gate of a field-effect transistor is minimized, providing better control over effective channel length, and less sensitivity of channel length to processing parameters, while also minimizing early high-temperature history of the wafer being processed. Moreover, alternative embodiments of the invention naturally produce a graded drain profile.

What is claimed is:

1. A method for fabricating a field-effect transistor, comprising the steps of:
  (a) providing a semiconductor substrate having a surface of a first conductivity type;
  (b) providing, near said semiconductor surface, a gate electrode defining a channel region in said substrate beneath said gate electrode, said semiconductor surface also containing areas for source and drain regions separated by said channel region;
  (c) depositing a dopant impurity source having a second conductivity type directly on said semiconductor surface over said source and drain regions; and
  (d) illuminating said dopant with pulsed radiant heating to ionize and drive said dopant within said semiconductor surface at said source and drain regions with substantially minimal spread of source and drain diffusions underneath said gate.

2. The method of claim 1, wherein said pulsed illumination step comprises pulsed laser illumination.

3. The method of claim 1, wherein said semiconductor comprises silicon, and said second-type dopant comprises antimony.

4. The method of claim 1, wherein said dopant introduction step comprises appplying a high concentration of a dopant source to said semiconductor surface.

5. The method of claim 1, wherein said dopant introduction step comprises both appplying a high concentration of a dopant source to said semiconductor surface and also implanting a second dopant source within the surface of said semiconductor, prior to said transient heating step.

6. The method of claim 1, wherein said transient heating step applies energy at an area density less than 0.3 Joule per square cm.

7. The method of claim 5, wherein said first and second dopant sources respectively comprise different species.

8. The method of claim 7, wherein said first dopant source comprises antimony and said second dopant source comprises phosphorus.

9. The method of claim 7, wherein said first dopant source comprises antimony and said second dopant source comprises arsenic and phosphorus.

10. The method of claim 7, wherein said first dopant source comprises antimony and said second dopant source comprises arsenic.

* * * * *